United States Patent [19]
Hu et al.

[11] Patent Number: 5,831,218
[45] Date of Patent: Nov. 3, 1998

[54] METHOD AND CIRCUIT BOARD PANEL FOR CIRCUIT BOARD MANUFACTURING THAT PREVENTS ASSEMBLY-LINE DELAMINATION AND SAGGING

[75] Inventors: Kai X. Hu, Cary; Xinyu Dou, Fox River Grove; Chao-Pin Yeh, Schaumburg; Don Dillard, Mundelein; Delbert Juarezl, Grayslake; Gary Mui, Wheeling; Tom Brey, Lake In The Hills; Rich Dlesk, Grayslake; Karl Wyatt, Cary; Dave Roller, Libertyville, all of Ill.

[73] Assignee: Motorola, Inc., Schaumburg, Ill.

[21] Appl. No.: 672,736

[22] Filed: Jun. 28, 1996

[51] Int. Cl.[6] .................................................... H05K 1/00
[52] U.S. Cl. ............................................. 174/250; 29/846
[58] Field of Search ............................... 438/33, 68, 113, 438/114, 458, 460; 29/846, 848, 413, 414; 361/748; 174/250

[56] References Cited

U.S. PATENT DOCUMENTS

| | | |
|---|---|---|
| 3,144,709 | 8/1964 | Hansson et al. ............................ 29/413 |
| 3,535,774 | 10/1970 | Baker ........................................ 438/460 |
| 3,608,186 | 9/1971 | Hutson ...................................... 438/114 |
| 3,972,113 | 8/1976 | Nakata et al. ............................ 438/465 |
| 4,900,283 | 2/1990 | Fukae ......................................... 438/28 |
| 5,000,811 | 3/1991 | Campanelli .............................. 156/264 |
| 5,128,282 | 7/1992 | Ormond et al. ........................... 438/68 |
| 5,284,732 | 2/1994 | Forster et al. ............................ 430/264 |

Primary Examiner—Kristine L. Kincaid
Assistant Examiner—Kristina Soderquist
Attorney, Agent, or Firm—Darleen J. Stockley

[57] ABSTRACT

Board delamination during the singulation from a board panel and board sagging during front-end assembly are two biggest problems encountered in cellular manufacturing lines. The method (700) and circuit board panel (600) of the present invention substantially eliminate assembly-line delamination and sagging for circuit board manufacturing. A number of slots are punched to fit into a circuit board profile. V-grooves are cut along each of the circuit board profiles through the slots and directly opposite on a top and bottom of the circuit board. Thus, optimization of the cut-outs and v-groove configurations eliminate tearing/delamination and substantially reduce sagging.

4 Claims, 4 Drawing Sheets

METHOD AND CIRCUIT BOARD PANEL FOR CIRCUIT BOARD MANUFACTURING THAT PREVENTS ASSEMBLY-LINE DELAMINATION AND SAGGING

FIELD OF THE INVENTION

The present invention relates to circuit board manufacturing and more particularly, to assembly-line processes in the circuit board manufacturing.

BACKGROUND OF THE INVENTION

For easy handling and component placement, panels that consist of multiple (usually three) printed circuit boards, are widely used in manufacturing lines. These panels are routed along the boundaries of each board except for a few connecting points (called break-aways) to fit into a housing profile. After components are placed and reflowed, populated boards are to be singulated or depanelized by breaking or cleaving these break-aways. Depanelization is often performed manually by operators. Nearby conducting circuit lines or connecting pads on boards may, however, be torn off or delaminated when breakage does not cleave cleanly (202; 302) through the thickness of the break-aways (FIG. 2 and FIG. 3). Another problem associated with board panels is the sagging of boards during various stages of the assembly process (FIG. 4). As board density continues to increase, the clearance between the board edges and the conducting circuit lines/pads shrinks. Typical manufacturing lines report that this depanelization tearing-off and sagging are constantly among the top five problems encountered by cellular factories. There is an imminent need for a new board panel design that will eliminate depanelization-related delamination while minimizing the board sagging.

Two methods are currently practiced to make depanelization easy. The first method utilizes 'H' shaped break-away connections with cutouts that extend completely through the whole board thickness (see FIG. 1). Break-away joints present a weak link to allow easy depanelization. This method does not, however, prevent board delamination/tearoff. In addition, the punched routing weakens the panel to such a large extent that the panel sags substantially on the conveyor, interfering with correct placement of electrical components on the boards. The second method applies v-grooves to a line along which the panel will be broken. Although v-grooves have been used for a long time for products such as a PC (personal computer) mother board, PCMCIA cards (Personal Computer Memory Card Industry Association cards), etc., v-grooves cannot be used for printed circuit boards where the board boundary profile is not straight-lined. For example, v-grooves are not suitable where non-straight-lined boards are implemented for cellular products with zig-zagged or curved board boundaries that are employed for housing assembly and real estate considerations.

DETAILED DESCRIPTION OF A PREFERRED EMBODIMENT

The present invention provides an inexpensive and versatile method and circuit board panel for preventing assembly-line delamination and sagging for circuit board manufacturing. When the method of the present invention has been utilized during circuit board manufacturing, the circuit board panel may then be broken, typically manually, into individual circuit boards that typically are undamaged, particularly with respect to edge-located laminated circuits. The method and circuit board panel of the present invention also minimize sagging problems, thus facilitating accurate placement of electrical components on the circuit board panel and execution of process automation.

Figure 1:
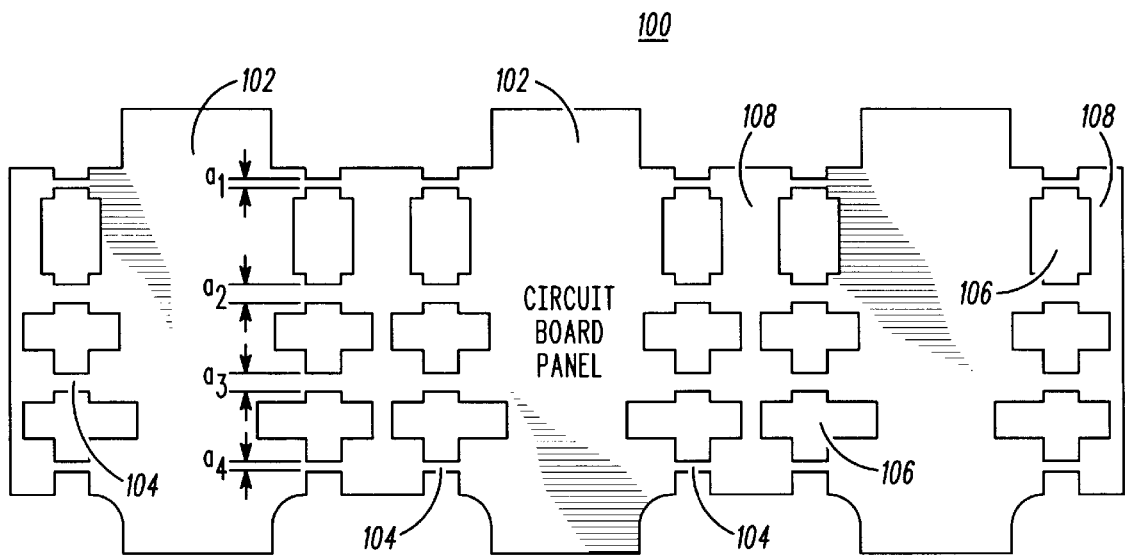
FIG. 1 shows a typical 'H' shaped break-away design as is known in the art.
Figure 2:
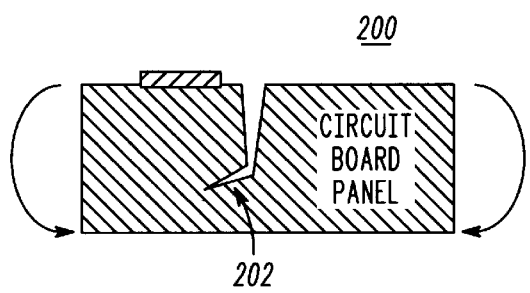
FIG. 2 is a schematic representation of tearing/delamination that typically occurs due to the fact that a crack tip encounters a compressive stress state upon using the "H" shaped break-away design of FIG. 1.
Figure 3:
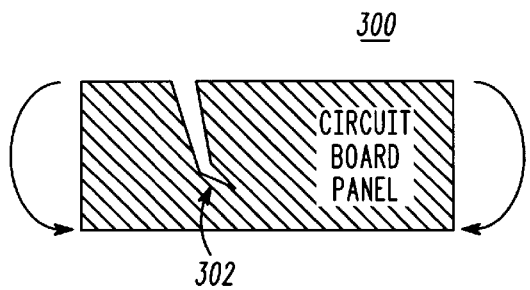
FIG. 3 is a schematic representation of unsymmetric crack initiation due to the mixture of tensile and shear stress states, increasing potential for curved fracture path that also typically occurs upon using the "H" shaped break-away design of FIG. 1.

FIG. 1, numeral 100, shows a printed circuit board panel with three printed circuit boards (102), 'H' shaped break-away (104), cut-outs (106) that routed the board profile, and throw-away strips (108), as is known in the art. Due to the routing needs, the throw-away strips are always required. This design does not provide a mechanism to eliminate delamination due to two reasons. First, the breakage is much easier on the top side of the break-away where the stresses are generally in tension, but become progressively more difficult as the breakage tip reaches the bottom side of the break-away, where the stress is in a compressive state. As a result, tearing or delamination (202) is apt to occur (FIG. 2, numeral 200). Second, depending on the surface conditions, the initial breakage may not always start right at the middle (302) of the break-away. This can create an unsymmetric stress state, increasing potential for a curved fracture path (FIG. 3, numeral 300).

Figure 4:
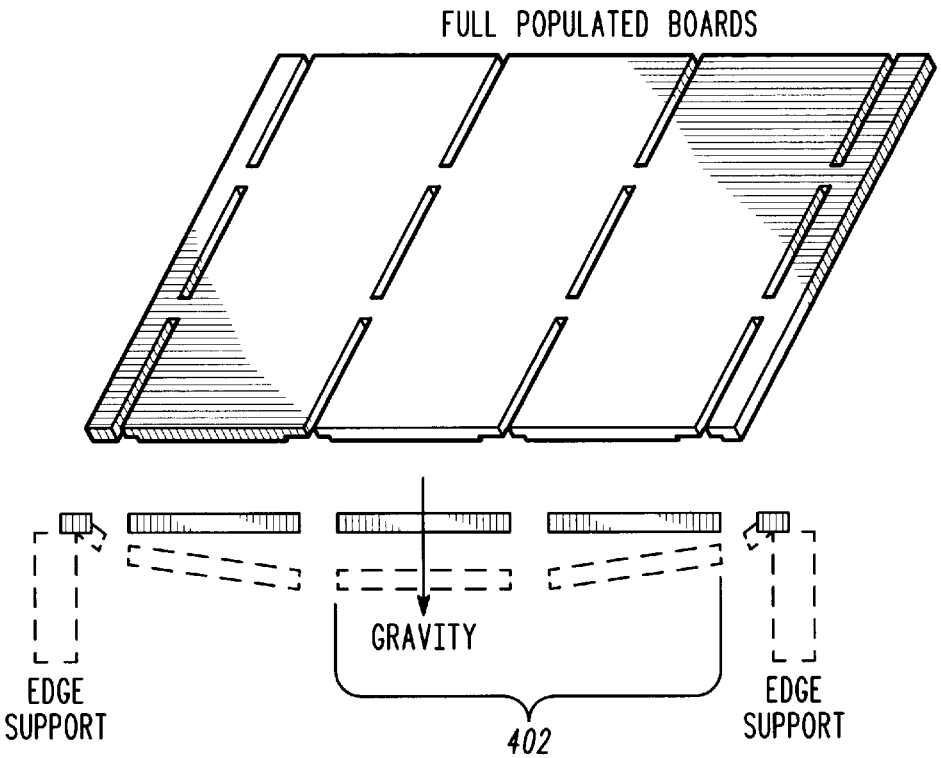
FIG. 4 shows a schematic of a prior art circuit board that is sagging due to the fact that the break-away joints present a weak link that induces a large displacement in the middle of the board panel during manufacturing.

FIG. 4, numeral 400, shows a schematic of a prior art circuit board that is sagging (402) due to the fact that the break-away joints present a weak link that induces a large displacement in the middle of the board panel during manufacturing.

Figure 5:
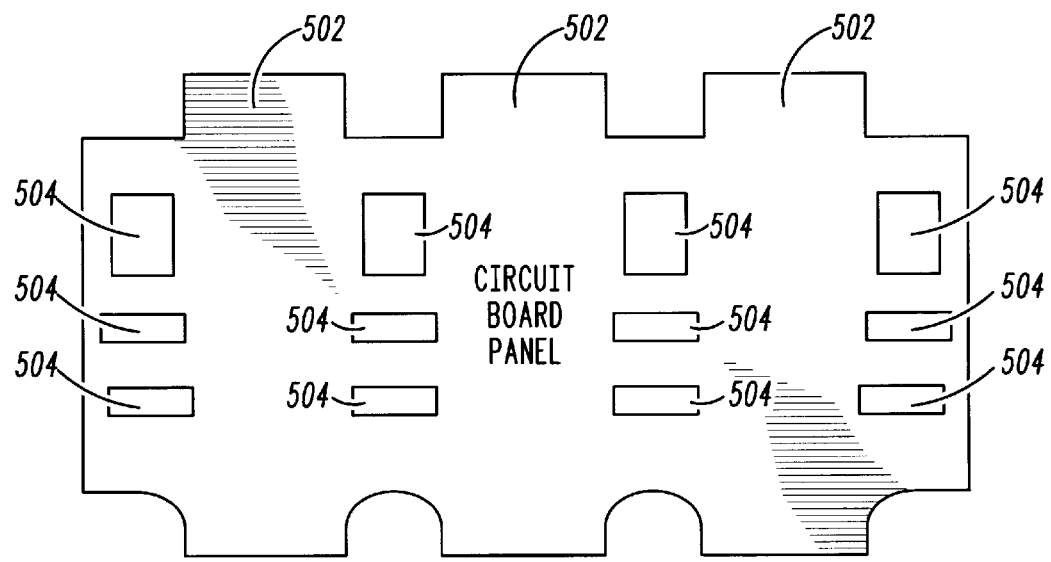
FIG. 5 is a schematic representation of a circuit board panel after cut-outs have been implemented in a first step for substantially eliminating assembly-line delamination and sagging in accordance with the present invention.
Figure 6:
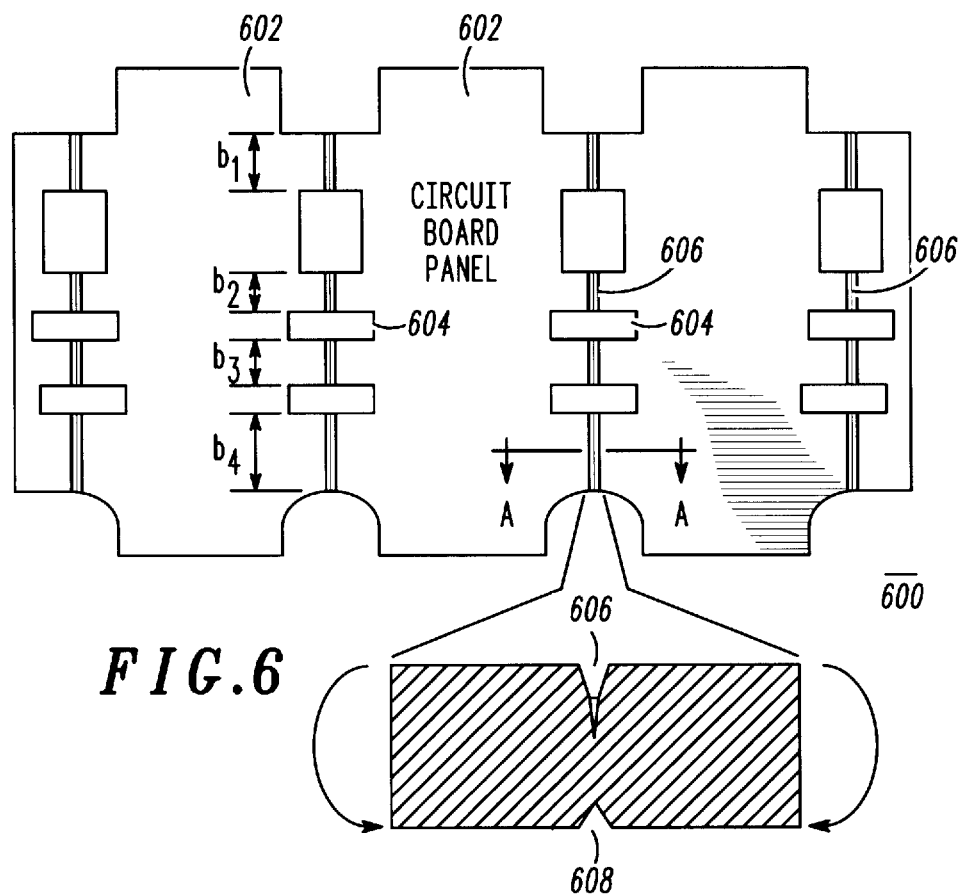
FIG. 6 is a schematic representation of a circuit board panel after v-grooves have been implemented in the second step for substantially eliminating assembly-line delamination and sagging in accordance with the present invention.

FIG. 5, numeral 500, is a schematic representation of a circuit board panel with three printed circuit boards (502) after cut-outs (504) have been implemented in a first step for substantially eliminating assembly-line delamination and sagging in accordance with the present invention. It is noted that the middle throw-away strips are not required for the present invention. FIG. 6, numeral 600, furnishes a schematic representation of a circuit board panel with three printed circuit boards (602) cut-outs (604) after applying v-grooves (606 and 608) along the board profile to the areas left over by cut-outs, for substantially eliminating assembly-line delamination and sagging in accordance with the present invention. The v-grooves are cut in accordance with an angle determined by an equation of the form:

$$\alpha_c = 2\tan^{-1}\left(\frac{W_c}{2H_c}\right), \quad (A)$$

where $\alpha_c$ represents a cutting angle for the v-groove, $W_c$ represents a distance across a widest opening of the v-grooves, and $H_c$ represents a depth of the v-grooves. For most cellular applications, the v-grooves generally have a v angle of 25° to 30°.

Figure 7:
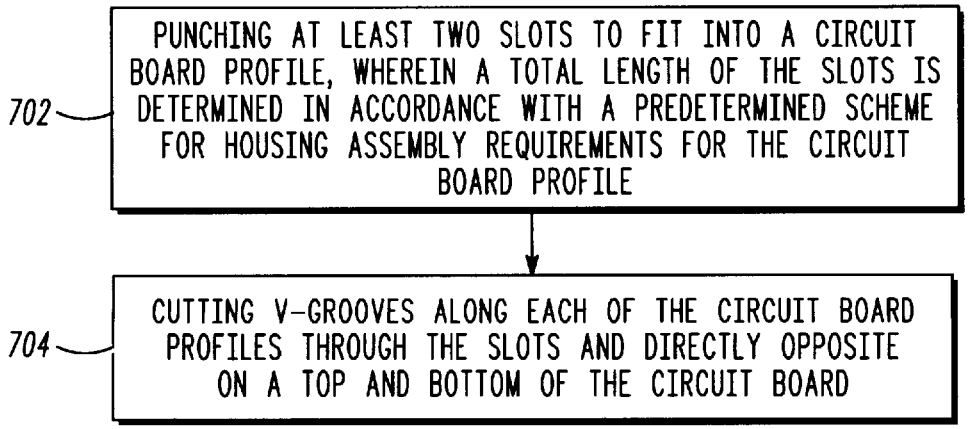
FIG. 7 is a flow chart of one embodiment of steps of a method for substantially eliminating assembly-line delamination and sagging for circuit board manufacturing in accordance with the present invention.

FIG. 7, numeral 700 is a flow chart of one embodiment of steps of a method for substantially eliminating assembly-line delamination and sagging for circuit board manufacturing in accordance with the present invention. First, With inputs from housing requirements (cosmetic, mechanical assembly, testing, etc.), the board profile can be determined. Second, the dimensions of cut-outs and v-grooves are to be optimized to eliminate delamination and to reduce sagging. Third, the boards are designed to fulfill a housing profile through cut-out areas. The width of connection areas left over by cut-outs is much longer than the width of connection areas left by routed break-away joints, normally more than 10 times longer than a routed break-away joints, referring to FIG. 1 and FIG. 6 for comparisons, where $(a_1+a_2+a_3+a_4) << (b_1+b_2+b_3+b_4)$. This drastically increases the panel stiffness and reduces sagging. Finally, v-grooves are introduced along board boundaries on the areas left out by cut-outs. V-shape notches both on the top and the bottom sides along board boundaries are utilized (shown in FIG. 6). The notch on the top will provide a controlled breakage initiation and the notch on the bottom will ensure enough crack propagation force to cleave boards all the way through. The tensile stress concentration near the top v-notch will guide the crack tip to propagate downward. The top v-notch also dictates exactly where the initial breakage starts. As this crack propagates, the crack tip will interact with the tip at the bottom v-notch. The interaction between the propagating crack tip and the bottom notch tip will ensure the complete breakage without tearing or delamination.

Thus, as shown in FIG. 7, the method includes the steps of: A) punching (702) at least two slots to fit into a circuit board profile, wherein a total length of the slots is determined in accordance with a predetermined scheme for housing assembly requirements for the circuit board profile; and B) cutting (704) v-grooves along each of the circuit board profiles through the slots and directly opposite on a top and bottom of the circuit board.

The depth of the v-grooves is determined in accordance with equations of the form:

$$\frac{6M}{H^2}\sqrt{\pi H_c}\, F\left(\frac{H_c}{H}, \frac{L_c}{H}\right) \geq K_{Ic}, \quad (B)$$

wherein M represents a moment about an axis of the v-groove upon depanelization; H represents a thickness of the circuit board; $H_c$ represents a depth of a cut of the v-groove; F represents a predetermined function of a depth of the cut of the v-groove and the total length $L_c$ of the slots; and $K_{Ic}$ represents a constant for a toughness of material of the circuit board; and $$\frac{\alpha P (3W)^3}{E(H - H_c)^3 (L - L_c)} \leq \delta_c, \quad (C)$$

wherein $\alpha$ represents a dimensionless constant from 0.3 to 0.6 determined by a simulation; P represents a weight of a circuit board panel containing a predetermined number of circuit boards; W represents a width of the circuit board; E represents a modulus of material for the circuit board; L represents a total length of the circuit board profile; and $\delta_c$ represents a predetermined manufacturing tolerance for sagging.

Equation (B) ensures that crack can easily propagate during a depanelization operation and Equation (C) ensures that the sagging will be limited to operational range. The optimization is rendered by numerical modeling to simultaneous gratification of Equations (B) and (C).

Figure 8:
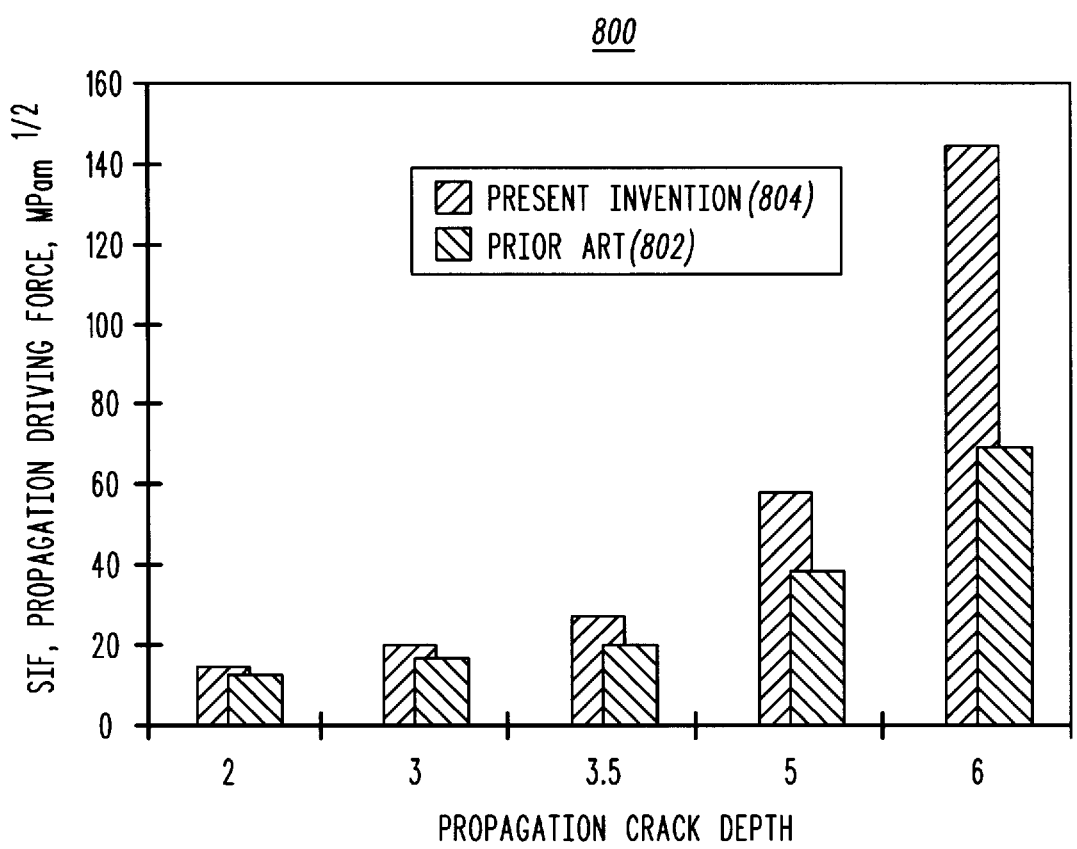
FIG. 8 illustrates comparisons of crack-propagation driving forces between a prior art break-away design and the present invention.

FIG. 8, numeral 800, illustrates comparisons of crack-propagation driving forces between a prior art break-away (802) design and the present invention (804). This provides the reason why the current invention completely eliminates delamination. In fact, due to the existence of the bottom notch, the crack propagation driving force is twice as the force without it during the critical stage of final depanelization (see FIG. 8; SIF is the stress intensity factor).

Board delamination during the singulation from a board panel and board sagging during front-end assembly are two of the biggest problems encountered in cellular manufacturing lines. All existing designs for board panels untilize an routed 'H' shape break-away connections. Although the 'H' shaped break-away makes depanelization easy, it does not prevent board delamination or tear-off. On the other hand the 'H' shaped break-away introduces significant board sagging due to the weakness of break-away joints. Another approach to make singulation easy is to use v-grooves. But v-grooves can so far be implementable only along straight lines. For a typical cellular board, board boundaries are zig-zagged or highly curved for cosmetic, housing, signal (antenna) and testing considerations. This invention provides a new board panel design to eliminate board delamination during depanelization and to reduce sagging during assembly processes. The board panel design of the present invention utilizes a unique combination of cut-outs and v-grooves to produce a highly curved, complex board profile. The cut-out areas are normally very small (just enough for fitting into housing grips). Therefore, the length of connection areas is much longer, normally more than 10 times longer than a routed break-away design as shown in FIGS. 1 and 6 where $(a_1+a_2+a_3+a_4) << (b_1+b_2+b_3+b_4)$. This drastically increases the panel stiffness and reduces sagging. The v-grooves are introduced along board boundaries on the areas left out by cut-outs. V-shape notches both on the top and the bottom sides along board boundaries are applied. The notch on the top will provide a controlled breakage initiation and the notch on the bottom will ensure enough crack propagation force to cleave boards all the way through. The tensile stress concentration near the top v-notch will guide the crack tip to propagate downward. The top v-notch also dictates exactly where the initial breakage starts. As this crack propagates, the crack tip will interact with the tip at the bottom v-notch. The interaction between the propagating crack tip and the bottom notch tip will ensure the complete breakage without tearing or delamination. In fact, due to the existence of the bottom notch in the present invention, the crack propagation driving force for the present invention is twice as large as the crack propagation force required for the prior art implementation. This high level of crack propagation driving forces ensures, in the present invention, a compete elimination of delamination during singulation.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method for substantially eliminating assembly-line delamination and sagging for circuit board manufacturing, comprising the steps of:
   A) punching at least two slots to fit into a circuit board profile, wherein a total length of the slots is determined in accordance with a predetermined scheme for housing assembly requirements for the circuit board profile; and
   B) cutting v-grooves along the circuit board profile through the slots and directly opposite on the top and bottom of the circuit board profile, wherein the v-grooves are cut in accordance with an angle determined by an equation of the form:

$$\alpha_c = 2\tan^{-1}\left(\frac{W_c}{2H_c}\right), \qquad (A)$$

where $\alpha_c$ represents a cutting angle for the v-grooves, $W_c$ represents a distance across the widest opening of the v-grooves, and $H_c$ represents a depth of the v-grooves.

2. A method for substantially eliminating assembly-line delamination and sagging for circuit board manufacturing, comprising the steps of:
   A) punching at least two slots to fit into a circuit board profile, wherein a total length of the slots is determined in accordance with a predetermined scheme for housing assembly requirements for the circuit board profile; and
   B) cutting v-grooves along the circuit board profile through the slots and directly opposite on the top and bottom of the circuit board profile, wherein a depth of the v-grooves is determined in accordance with equations of the form:

$$\frac{6M}{H^2} \sqrt{\pi H_c} \; F\left(\frac{H_c}{H}, \frac{L_c}{H}\right) \geq K_{Ic}, \qquad (B)$$

wherein M represents a moment about an axis of the v-grooves upon depanelization; H represents a thickness of the circuit board; $H_c$ represents a depth of a cut of the v-grooves; F represents a predetermined function of the depth of the cut of the v-grooves and the total length $L_c$ of the slots; and $K_{Ic}$ represents a constant for a toughness of material of the circuit board profile; and $$\frac{\alpha P(3W)^3}{E(H-H_c)^3(L-L_c)} \leq \delta_c, \qquad (C)$$

wherein $\alpha$ represents a dimensionless constant from 0.3 to 0.6 determined by a simulation; P represents a weight of a circuit board panel containing a predetermined number of circuit board profiles; W represents a width of the circuit board profile; E represents a modulus of material for the circuit board profile; L represents a total length of the circuit board profile; and $\delta_c$ represents a predetermined manufacturing tolerance for sagging.

3. A circuit board panel for substantially eliminating assembly-line delamination and sagging for circuit board manufacturing, comprising:
   a plurality of circuit board modules having printed circuit boards arranged in parallel wherein each of said modules includes:
      A) a plurality of cut-outs along a circuit board profile; and
      B) v-grooves along the circuit board profile left over by cut-outs and directly opposite on the top and bottom of the circuit board profile, wherein the v-grooves are cut in accordance with an angle determined by an equation of the form:

$$\alpha_c = 2\tan^{-1}\left(\frac{W_c}{2H_c}\right), \qquad (A)$$

where $\alpha_c$ represents a cutting angle for the v-grooves, $W_c$ represents a distance across the widest opening of the v-grooves, and $H_c$ represents a depth of the v-grooves.

4. A circuit board panel for substantially eliminating assembly-line delamination and sagging for circuit board manufacturing, comprising:
   a plurality of circuit board modules having printed circuit boards arranged in parallel wherein each of said modules includes:
      A) a plurality of cut-outs along a circuit board profile; and
      B) v-grooves along the circuit board profile left over by cut-outs and directly opposite on the top and bottom of the circuit board profile, wherein a depth of the v-grooves is determined in accordance with equations of the form:

$$\frac{6M}{H^2} \sqrt{\pi H_c} \; F\left(\frac{H_c}{H}, \frac{L_c}{H}\right) \geq K_{Ic}, \qquad (B)$$

wherein M represents a moment about an axis of the v-grooves upon depanelization; H represents a thickness of the circuit board panel; $H_c$ represents a depth of a cut of the v-grooves; F represents a predetermined function of the depth of the cut of the v-grooves and the total length $L_c$ of the slots; and $K_{Ic}$ represents a constant for a toughness of material of the circuit board panel; and $$\frac{\alpha P(3W)^3}{E(H-H_c)^3(L-L_c)} \leq \delta_c, \qquad (C)$$

wherein $\alpha$ represents a dimensionless constant from 0.3 to 0.6 determined by a simulation; P represents a weight of a circuit board panel containing a predetermined number of circuit board profiles; W represents a width of the circuit board profile; E represents a modulus of material for the circuit board profile; L represents a total length of the circuit board profile; and $\delta_c$ represents a predetermined manufacturing tolerance for sagging.

* * * * *